(12) United States Patent
Brockway et al.

(10) Patent No.: US 11,912,890 B2
(45) Date of Patent: *Feb. 27, 2024

(54) LIQUID-REPELLENT COATINGS

(71) Applicant: The Regents of the University of California, Oakland, CA (US)

(72) Inventors: Lance Brockway, Oakland, CA (US); Hayden Kingsley Taylor, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/701,546

(22) Filed: Mar. 22, 2022

(65) Prior Publication Data

US 2022/0403180 A1 Dec. 22, 2022

Related U.S. Application Data

(63) Continuation of application No. 15/752,868, filed as application No. PCT/US2016/047680 on Aug. 19, 2016, now Pat. No. 11,326,060.
(Continued)

(51) Int. Cl.
*C09D 5/00* (2006.01)
*C09D 7/65* (2018.01)
(Continued)

(52) U.S. Cl.
CPC .............. *C09D 5/002* (2013.01); *C09D 1/00* (2013.01); *C09D 5/1618* (2013.01);
(Continued)

(58) Field of Classification Search
CPC .... C09D 5/1681; F28F 2245/04; F28F 13/04; F28F 13/185; F28F 13/187
See application file for complete search history.

(56) References Cited

U.S. PATENT DOCUMENTS

2010/0294475 A1* 11/2010 Rush ..................... H01L 23/427
165/185
2014/0110263 A1 4/2014 Barbier et al.

FOREIGN PATENT DOCUMENTS

| CN | 101270260 A | 9/2008 |
| CN | 101544476 A | 9/2009 |
| CN | 103191855 A | 7/2013 |

OTHER PUBLICATIONS

Lv et al., "Fabrication of Superhydrophobic Films on Aluminum Foils with Controllable Morphologies," Advanced Materials Research 641-642;414-417;2013 (Year: 2013).*

(Continued)

*Primary Examiner* — Jasper Saberi
(74) *Attorney, Agent, or Firm* — Seed IP Law Group LLP

(57) ABSTRACT

The invention relates generally to liquid-repellent coatings, and in particular, to porous liquid-repellent coatings, a method of preparing the porous liquid-repellent coatings, and a method of characterizing a porous surface for the liquid-repellent coatings. The invention further relates to a porous liquid-repellent coating comprising a porous layer of a transition metal oxide and/or hydroxide and a layer of a liquid-repellent compound deposited onto the porous layer of the transition metal oxide and/or hydroxide, wherein the porous layer of the transition metal oxide and/or hydroxide is comprised of a plurality of surface pores of varying angles with an average angle that is re-entrant.

7 Claims, 7 Drawing Sheets

Related U.S. Application Data

(60) Provisional application No. 62/207,109, filed on Aug. 19, 2015.

(51) Int. Cl.
    *C09D 7/40*     (2018.01)
    *C09D 1/00*     (2006.01)
    *C09D 127/18*     (2006.01)
    *C23C 22/05*     (2006.01)
    *C23C 22/73*     (2006.01)
    *F28F 13/18*     (2006.01)
    *C09D 5/16*     (2006.01)
    *F28F 13/04*     (2006.01)

(52) U.S. Cl.
    CPC ............ *C09D 5/1681* (2013.01); *C09D 7/65* (2018.01); *C09D 7/70* (2018.01); *C09D 127/18* (2013.01); *C23C 22/05* (2013.01); *C23C 22/73* (2013.01); *F28F 13/04* (2013.01); *F28F 13/185* (2013.01); *F28F 13/187* (2013.01); *F28F 2245/04* (2013.01)

(56) References Cited

OTHER PUBLICATIONS

Office Action, dated Dec. 22, 2023, for Chinese Application No. 202310921567.1 (w/ English Translation) (11 pages).

\* cited by examiner

LIQUID-REPELLENT COATINGS

CROSS-REFERENCE TO RELATED APPLICATION

This application is a continuation of U.S. patent application Ser. No. 15/752,868, filed Feb. 14, 2018, which is a National Stage Entry of PCT/US2016/047680, filed Aug. 19, 2016, which claims the benefit of priority of U.S. Provisional Patent Application No. 62/207,109, filed Aug. 19, 2015, the contents of which being hereby incorporated by reference in its entirety for all purposes.

TECHNICAL FIELD

The invention relates generally to liquid-repellent coatings, and in particular, to porous liquid-repellent coatings, a method of preparing the porous liquid-repellent coatings, and a method of characterizing a porous surface for the liquid-repellent coatings.

BACKGROUND

Dropwise condensation has recently been predicted and shown to exhibit enhanced heat transfer on air-side heat exchangers. To achieve dropwise condensation, a superhydrophobic surface is needed.

Many methods of decreasing the surface energy to superhydrophobic levels have been proposed. Superhydrophobicity can be achieved by creating a surface with a very high area and a hydrophobic chemistry. In typical superhydrophobic coatings, the creation of a large surface area has typically been accomplished either by top-down patterning of silicon wafers using costly photoresist and relatively insulating substrates, or by spray-on polymer coatings that are prone to abrasive and thermal degradation.

In contrast, the bottom-up growth of high surface area coatings has the potential to be much less expensive than top-down lithography and more robust than spray-on coatings. However, very few feasible bottom-up processes have been demonstrated, all of them requiring either relatively complex and/or expensive chemistries or the inability to be grown on the most common heat exchanger materials, aluminum and stainless steel. As a result, there are very few coatings which are affordable and robust enough for commercial heat exchanger applications.

Dropwise condensation has multiple potential benefits:
a. Enhanced heat transfer at the cooling surface, requiring less chilling of the coolant to achieve a given reduction of air temperature and consequently lower energy consumption;
b. The absence of a water film on the cooling surfaces (typically arrays of parallel metal plates, or 'fins') results in less impedance to air flow, lowering the air pumping power required;
c. Less risk of fungal or bacterial growth inside the heat exchanger due to there being no standing water on the surfaces.

Therefore, there remains a need to provide for a liquid-repellent coating for a surface that overcomes, or at least alleviates the above problems.

SUMMARY

According to one aspect of the invention, there is provided a porous liquid-repellent coating. The coating may include a porous layer of a transition metal oxide and/or hydroxide. The coating may further include a layer of a liquid-repellent compound deposited onto the porous layer of the transition metal oxide and/or hydroxide. The porous layer of the transition metal oxide and/or hydroxide may be comprised of a plurality of surface pores of varying angles with an average angle that is reentrant.

In preferred embodiments, based on a Gaussian distribution model for the angles of the plurality of surface pores, the standard deviation $\sigma_0$ of the angles with respect to the average reentrant angle $\Psi_0$ is between 0 and 60°, preferably between 0 and 40°.

According to another aspect of the invention, there is provided a method of preparing a porous liquid-repellent coating on a substrate. The coating may include a coating of the earlier aspect described above. The method may include immersing a substrate in a solution of a transition metal nitrate salt and a weak base at a temperature range of between 20° C. and 100° C. to form a porous layer of a transition metal oxide and/or hydroxide on the substrate. The method may further include depositing a layer of a liquid-repellent compound onto the porous layer of the transition metal oxide and/or hydroxide to form the porous liquid-repellent coating on the substrate.

According to a further aspect of the invention, there is disclosed a method of characterizing a porous surface having a plurality of surface pores in terms of an average reentrant angle $\Psi_0$ and the standard deviation $\sigma_0$ of the angle of the plurality of surface pores with respect to $\Psi_0$. The method may include:

measuring a respective contact angle $\theta_0$ of at least four probe liquids each having a different surface tension, wherein the contact angle on a flat surface is measured by a sessile drop method; measuring a respective apparent contact angle $\theta^*$ of the at least four probe liquids, wherein the apparent contact angle on the porous surface is measured by a sessile drop method; and using a least-squares error minimization routine to fit $\Psi_0$, $\sigma_0$, $\phi_T$ and r in the following equations:

$$P(\Psi) \approx \int_{-\infty}^{\Psi} \frac{1}{\sigma_0 \sqrt{2\pi}} e^{-\left(\frac{(\Psi'-\Psi_0)^2}{2\sigma_0^2}\right)} d\Psi' \quad (1)$$

$$\phi_F = 1 - P(\theta_0) \quad (2)$$

$$\cos\theta^* = \phi_T \cos\theta_0 + (1-\phi_T)[\phi_F r \cos\theta_0 - (1-\phi_F)]. \quad (3)$$

$$\phi_T \approx \frac{\cos\theta^* + 1}{\cos\theta_0 + 1} \quad (4)$$

wherein:
$P(\Psi)$ is the cumulative distribution function for the angle $\Psi$ according to a Gaussian distribution with average reentrant angle $\Psi_0$ and standard deviation $\sigma_0$,
$\Phi_F$ is the proportion of pores filled,
$\phi_T$ is a fraction of the area that sits at the tips of the porous surface between the pores and is always in contact with the liquid,
$(1-\phi_T)$ is the remaining area that is divided between a proportion $\Phi_F$ of pores that are filled, and a proportion $(1-\Phi_F)$ of unfilled pores in which a liquid-air interface exists, and
r is the roughness of the pores such that the total surface area of a pore is r times the projected area of one pore opening.

BRIEF DESCRIPTION OF THE DRAWINGS

The drawings are not necessarily drawn to scale, emphasis instead generally being placed upon illustrating the principles of various embodiments. In the following description, various embodiments of the invention are described with reference to the following drawings.

DESCRIPTION

Figure 1:
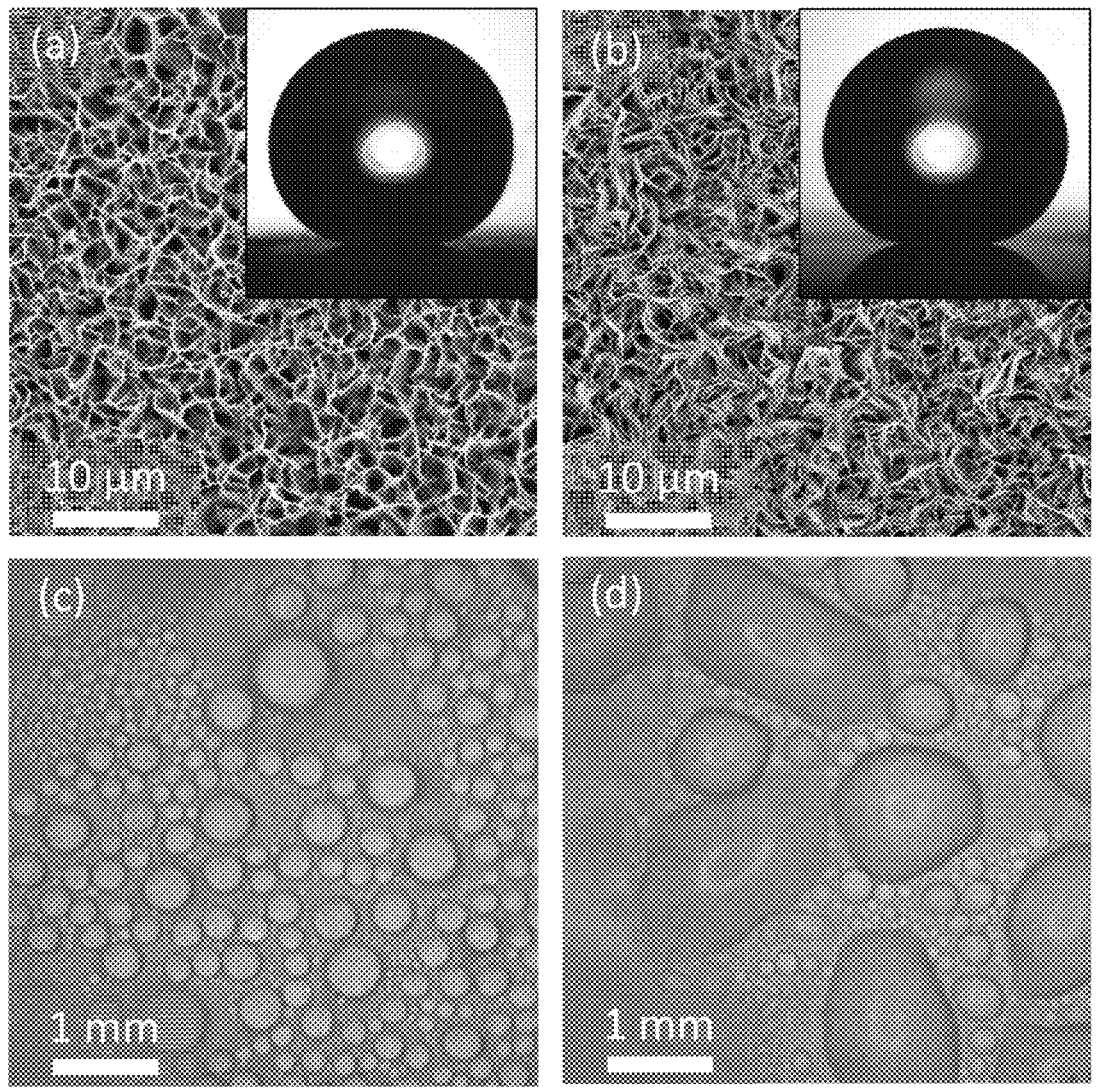
FIG. 1 shows scanning electron micrograph of a coated aluminum surface indicating the uniform porous mesh formed during the application of the coating. The inset is a water droplet with an equilibrium contact angle of (a) 172° and (b) 177°. Photographs of a coating promoting (c) drop-wise condensation with prompt droplet shedding and (d) condensation that floods the surface at equilibrium in an air conditioner simulator with high supersaturation and air velocity. This indicates that the samples synthesized at 70° C. (a) & (c) are superior under condensing conditions to those synthesized at higher temperatures of 110° C. (b) and (d), despite having a slightly lower contact angle.

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, chemical, and material changes may be made without departing from the scope of the invention. The various embodiments are not necessarily mutually exclusive, as some embodiments can be combined with one or more other embodiments to form new embodiments.

An exemplary embodiment of the present invention relates to a porous liquid-repellent coating. The coating is, in particular, water-repellent. The coating can be used in any applications where controlled wettability of a substrate, such as aluminum, is desired. This can easily be applied to the air side of any heat exchanger functioning in condensing environments, including but not limited to, air conditioning systems, refrigeration systems, and steam power plants. Hot water heater technology is also advancing to use condensation promoting systems to recover the latent heat of vaporization of water. Mist collector coatings could also be used to potentially reduce the energy cost of recovering water from fog.

The coating can also be used for coatings to prevent icing, such as on satellite dishes and airplane exteriors. There are also potential uses in catalysis.

However, in certain cases, it may also be useful to apply the porous liquid-repellent coating to a surface for repelling other liquids such as glycerol and methanol which are lower surface tension liquids than water.

In the present content, the term "porous" refers to a layer comprised of a plurality of surface pores. This is in contradistinction to a smooth or non-porous layer where surface pores are essentially absent. In other words, the porous layer may comprise a textured surface. More precisely, the textured surface may be comprised of varying degrees of pore geometrical heterogeneity. The pores may extend from the surface inwards to a certain depth of the porous layer. The pores may, but not necessarily, have different geometries from one another.

In various embodiments, a porous surface may be characterized in terms of an average reentrant angle $\Psi_0$ and the standard deviation go of the angles with respect to the average reentrant angle $\Psi_0$, according to Gaussian distribution model adopted in Eqn. (1). In the present content, the term "reentrant angle" refers to under-cut surface angle or pore sidewall angle.

The coating may include a porous layer of a transition metal oxide and/or hydroxide.

Suitable transition metal oxides and/or hydroxides may include zinc oxide/hydroxide, nickel (II) oxide/hydroxide, nickel (III) oxide/hydroxide, manganese (II) oxide/hydroxide, manganese (III) oxide/hydroxide, manganese (IV) oxide/hydroxide, manganese (VI) oxide/hydroxide, manganese (VII) oxide/hydroxide, copper (I) oxide/hydroxide, copper (II) oxide/hydroxide, cobalt (II) oxide/hydroxide, cobalt (III) oxide/hydroxide, iron (II) oxide/hydroxide, or iron (III) oxide/hydroxide. The porous layer may include only one type of transition metal oxide or hydroxide. Alternatively, the porous layer may include more than one type of transition metal oxide or hydroxide. The substrate may also contribute metal ions, in this case aluminium, to form mixed transition metal and aluminium oxide and/or hydroxide coatings. Accordingly, one advantage of the present coating is the low cost since the coating is based on some of the most common elements on earth. Additionally all precursor materials (to be described in later paragraphs) are currently used in existing commercial chemical synthesis with high availability. This results in very low cost compared to existing commercial coatings.

In preferred embodiments, the transition metal oxide/hydroxide is zinc oxide/hydroxide, iron oxide/hydroxide or manganese oxide/hydroxide.

The coating may further include a layer of a liquid-repellent compound deposited onto the porous layer of the transition metal oxide/hydroxide.

In the present context, the term "hydrophobic" refers to water-hating materials or the tendency to repel water. Quantitatively defined, a hydrophobicity generally refers to a water contact angle of more than 90°, such as 100°, 110°, or 120°. Accordingly, "superhydrophobicity" and "superhydrophobic" generally refer to a water contact angle of about 150° or more. Commonly, the water contact angle is measured by the sessile drop method.

For the sake of clarity and brevity, the term "liquid-repellent" as used in the present context shall include the terms "hydrophobic", "superhydrophobic", "oleophobic" (i.e. oil-repellent), "superoleophobic", and/or "omniphobic", and the like.

The porous layer of the transition metal oxide/hydroxide may be comprised of a plurality of surface pores of varying angles with an average angle that is reentrant. The plurality of the angles may be uniform (i.e. all same angle) or varied (i.e. different angles). Furthermore, not all pores need to have angles that are reentrant.

By "plurality" is meant more than one.

In other words, the porous layer is heterogeneous whereby not all the surface pores have the same angle.

In various embodiments, at least one of the plurality of surface pores has a reentrant angle of less than 90°. For example, the reentrant angle may be between 10° and 90°, such as 15°, 20°, 25°, 30°, 35°, 40°, 45°, and up to 90°.

In one embodiment, at least one of the plurality of surface pores has an angle of about 90°.

In other embodiments, at least one of the plurality of surface pores has an angle of more than 90°. For example, the angle may be between 90° and 160°, such as 95° 100°, 105°, 110°, 115°, 120°, 125°, and up to 160°.

In yet alternative embodiments, the plurality of surface pores may include at least one surface pore having a reentrant angle of less than 90° and at least one surface pore having an angle of more than 90°.

In certain preferred embodiments, based on a Gaussian distribution model for the angles of the plurality of surface pores according to Eqn. (1), the standard deviation $\sigma_0$ of the angles with respect to the average reentrant angle $\Psi_0$ is between 0 and 60°, such as 0°, 1°, 2°, 3°, 4°, 5°, 6°, 7°, 8°, 9°, 10°, 11°, 12°, 13°, 14°, 15°, 16°, 17°, 18°, 19°, 20°, 21°, 22°, 23°, 24°, 25°, 26°, 27°, 28°, 29°, 30°, 31°, 32°, 33°, 34°, 35°, 36°, 37°, 38°, 39°, 40°, 41°, 42°, 43°, 44°, 45°, 46°, 47°, 48°, 49°, 50°, 51°, 52°, 53°, 54°, 55°, 56°, 57°, 58°, 59°, or 60°. Preferably, the standard deviation $\sigma_0$ is between 0 and 40°. The higher the value of the standard deviation $\sigma_0$, the more textured (or heterogeneous) the surface is and this may be useful for quantifying the liquid-repellent (e.g. hydrophobicity if the liquid is water) performance of a surface.

In various embodiments, the liquid-repellent compound may be a fluorocarbon polymer or compound. Preferably, a low surface energy fluorocarbon polymer or compound is used to coat the porous layer of the transition metal oxide/hydroxide to render it liquid-repellent.

In various embodiments, the liquid-repellent compound may be a fluoroalkylsilane (FAS) or an alkylsilane, such as octadecylsilane (ODS).

In preferred embodiments, the liquid-repellent compound may be 1H, 1H, 2H, 2H-perfluorododecyltrichlorosilane, 1H, 1H, 2H, 2H-perfluorooctyltrichlorosilane (PFOS), 1H, 1H, 2H, 2H-perfluorodecyltriethoxysilane, 1H, 1H, 2H, 2H-perfluorodecyltrichlorosilane, 1H, 1H, 2H, 2H-perfluorooctyltriethoxysilane, octadecyltrichlorosilane, polyvinylidene fluoride (PVDF), polytetrafluoroethylene (PTFE), or perfluorooctyl polyhedral oligomeric silsesquioxane (PFO-POSS). Further variations for the FAS may include all ethoxy, methoxy, chloro, variations of the hexyl, octyl, decyl, and dodecyl variations. This could be methoxy, dimethoxy, trimethoxy, chloro, dichloro, trichloro, ethoxy, diethoxy, triethoxy for each octyl, decyl, and dodecyl combination. Further variations for the alkylsilane may include the same methoxy, chloro, or ethoxy leaving groups, with chain lengths including propyl, butyl, hexyl, hepta, octyl, nona, decyl, dodecyl, tetradecyl, hexadecyl, octadecyl, etc.

Advantageously, the pore size of the plurality of surface pores can be varied from less than 50 nanometers to more than 10 microns. This allows the coating to be used for multiple applications that require slightly different properties. The ability for the tune-ability of the pore sizes can be attributed to the ease of formation of the coating, which will be discussed next.

Briefly, the coating can be grown without templates in a relatively low-temperature water bath simply by submerging the substrate, rinsing it, and allowing it to dry.

Thus, in accordance with various embodiments, there is provided a method of preparing a porous liquid-repellent coating on a substrate. The coating may include a coating of the earlier aspect described above.

The method may include immersing a substrate (conveniently an aluminium substrate commonly used in heat exchangers) in a solution of a transition metal nitrate salt and a weak base at a temperature range of between 20° C. and 100° C. to form a porous layer of a transition metal oxide and/or hydroxide on the substrate.

Preferably, immersing the substrate comprises immersing the substrate in an equimolar solution of the transition metal nitrate salt and the weak base. It is to be recognized and appreciated that while an equimolar solution of the transition metal nitrate salt and the weak base has been found to work best, other molar ratios of the transition metal salt and the weak base may also be used. In other words, a higher molar ratio of the transition metal salt may be used or vice versa.

In various embodiments, the solution of the transition metal nitrate salt and the weak base has an equimolar concentration of between 1 mM and 1 M, such as 25 mM. Alternatively, as mentioned above, other molar ratios of the transition metal salt and the weak base may also be used so long as the respective concentration of the transition metal nitrate salt and the weak base falls within the range of between 1 mM and 1 M.

A further advantage of using the present method is that a relatively low temperature can be used to form the porous layer of the transition metal oxide and/or hydroxide, compared to typical hydrothermal processes that are above 100° C. in pressure vessels. In particular, the substrate may be immersed in the solution of the transition metal nitrate salt and the weak base at a temperature range of between 20° C. and 100° C., preferably between 20° C. and 70° C., such as 70° C.

In one preferred embodiment, the porous layer of the transition metal oxide and/or hydroxide may be subjected to a cleaning treatment prior to depositing the layer of the liquid-repellent compound. The advantage of including the cleaning treatment is that performance of the liquid-repellent coating can be improved. Furthermore, the combination of the cleaning step and the use of the weak base allows unlimited choices of the liquid-repellent compound to be deposited onto the porous layer of the transition metal oxide and/or hydroxide.

In various embodiments, the cleaning treatment may include a plasma treatment, a UV/ozone treatment, a heat treatment, a chemical cleaning step, or a combination thereof. Preferably an oxygen plasma treatment is used.

In preferred embodiments, the weak base may be hexamethylenetetramine (HMTA) or hexamine, triethanolamine, ammonia or urea.

In various embodiments, the transition metal nitrate salt may include a cation that has a +2 charge state. As mentioned earlier, for certain applications such as heat exchangers where the substrate is commonly aluminium, the transition metal may be selected from the group consisting of zinc, nickel, manganese, copper, cobalt, iron, and a mixture thereof.

In preferred embodiments, the transition metal nitrate salt may include zinc nitrate, iron nitrate, or manganese (II) nitrate.

The method may further include depositing a layer of a liquid-repellent compound onto the porous layer of the transition metal oxide and/or hydroxide to form the porous liquid-repellent coating on the substrate.

Conveniently, depositing the layer of the liquid-repellent compound may include dip coating or vapour deposition, which are common deposition techniques with minimal sophistication and cost. The liquid-repellent fluoroalkylsilane (FAS) or alkylsilane compound may be deposited in a vacuum desiccator or dip coated.

Alternatively, liquid-repellent perfluorooctyl polyhedral oligomeric silsesquioxane (PFO-POSS) compound may be dip coated onto the porous layer of the transition metal oxide and/or hydroxide.

Advantageously, the coating has been shown to prevent the corrosion of an underlying substrate in both acidic and basic conditions.

Other advantages include the following:
a) Robustness—The coating is a thin ceramic film that is chemically bound to the substrate. This results in superior abrasion and thermal resistance.
b) Performance—Contact angles in excess of 178° have been shown with this coating (to be described in later paragraphs). This is superior or equal to all commercial superhydrophobic coatings.
c) Translatable—Many different oxides and/or hydroxides such as zinc oxide/hydroxide (ZnO), manganese (IV) oxide/hydroxide ($MnO_2$) can be grown on different substrates to expand the possible applications to fields such as catalysis.

The following immediate paragraphs describe one exemplary embodiment of the present invention. The thus-formed porous liquid repellent coating is low-cost, facile, and tunable for various applications by simply changing the chemical bath temperature and reactant concentration. Contact angles as high as 178°, one of the highest reported to date, can be observed on the coated aluminum substrates. Additionally, the presented coating is unique in that it is chemically-bound to the aluminum substrate and ceramic-based. The chemical adhesion of a submicron ceramic film to aluminum increases the abrasion resistance of aluminum without measurably decreasing its thermal conductivity. This combination of cost, performance, tune-ability, and robustness has no current commercial equal. Furthermore, the coating has been shown to prevent the corrosion of aluminum without contact angle degradation under both acidic and basic conditions.

All materials for fabricating and characterizing the porous coatings were obtained from Sigma-Aldrich.

A superhydrophobic coating is grown on aluminum substrate by dipping the substrate in a water-based chemical bath with temperatures ranging from room temperature to 100° C. This solution contains a nitrate salt with a cation with a +2 charge state such as zinc, nickel, manganese, copper, cobalt, or iron. The solution also contains a weak base such as hexamine. The equimolar concentration of hexamine and the nitrate salt, ranging from 1 mM to 1 M, in the solution in conjunction with temperature determines the porosity of the grown film, and consequently, its properties. The films are then rinsed, dried, and treated with plasma, UV/ozone, heat treatment, or chemical treatment to activate the surface, followed by a second dip coating with perfluorosilanes to complete the coating. Any chloro, ethoxy, or methoxy silane will bond to the metal oxide/hydroxide surfaces. In this case, 1H, 1H, 2H, 2H-perfluorododecyltrichlorosilane was used to achieve the highest contact angles. The perfluorosilane coating can also be applied by vapor deposition in a vacuum desiccator.

Advantageously, the present method uses milder and gentler process parameters to form ZnO or $MnO_2$ on aluminum surfaces (room temperature to 100° C. at atmospheric pressure) which omits the use of an autoclave. Moreover, by forming the ZnO or $MnO_2$ at this temperature range, the pores are larger and the surface energy is higher. This results in more cost-efficient bonding of perfluorosilanes to the surface and promotes enhanced droplet shedding (see FIG. 1) relative to samples synthesized under autoclave conditions.

Films with controlled porosity result in various contact angles and contact angle hysteresis depending on reaction conditions. Example of contact angles and droplet shedding performance is shown in FIG. 1. It is useful to note that the coating prevents the flooding of the aluminum to maintain high efficiency and quickly shed water droplets.

Figure 2:
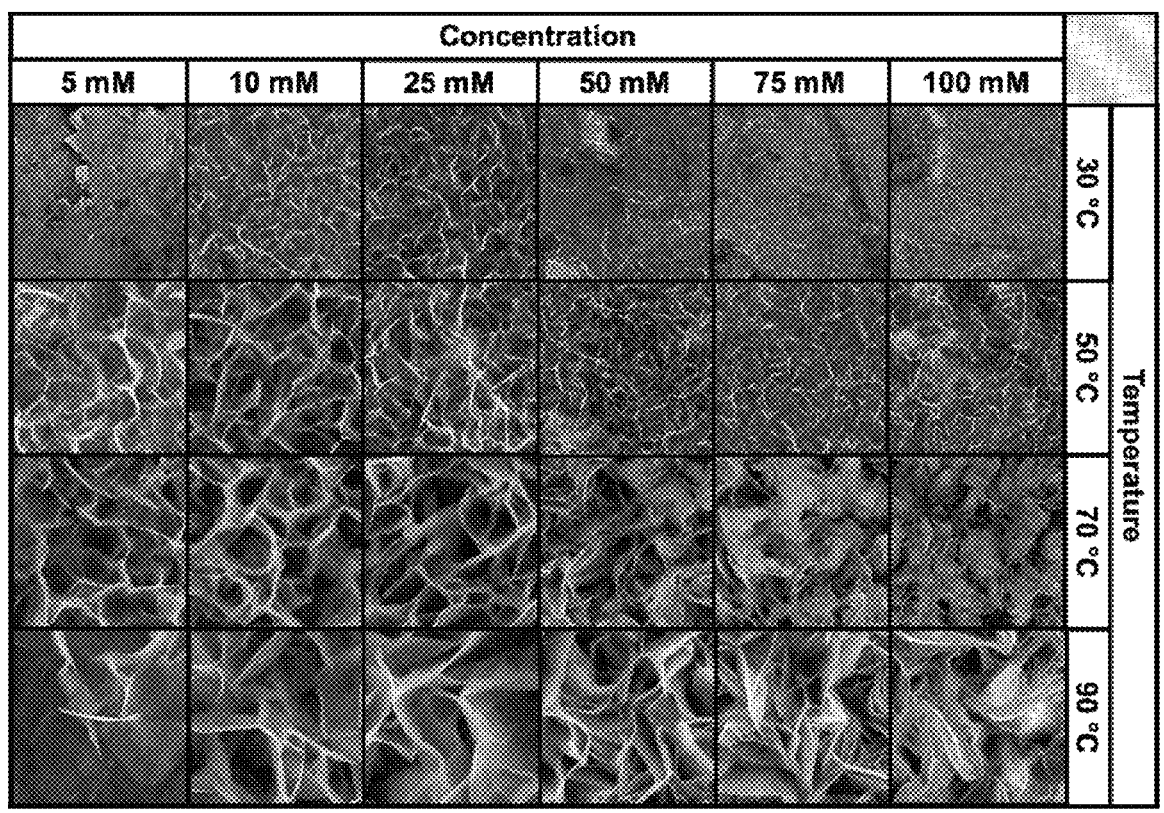
FIG. 2 shows a scanning electron micrograph of a coated aluminum surface indicating that the surface properties are tunable by simply varying the concentration and temperature of the reaction bath. Each frame in the figure is 6.5 μm in width. Pore size across this array ranges from below 100 nm to above 5 μm.
Figure 3:
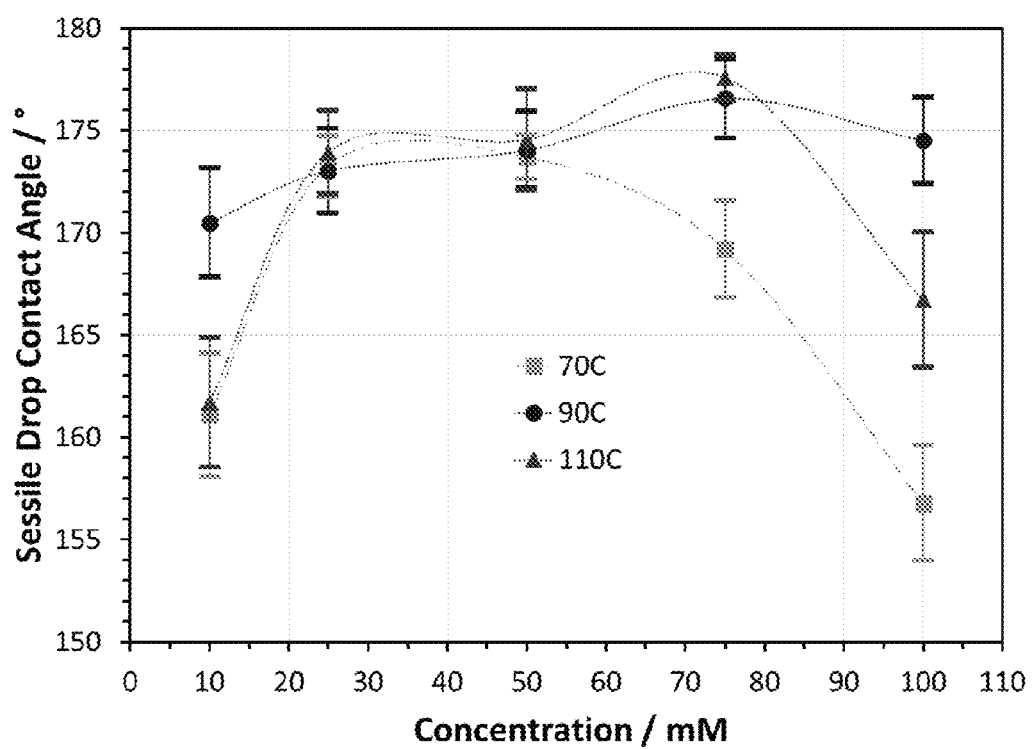
FIG. 3 shows a plot of contact angle versus reaction conditions for the most common used synthesis conditions. Despite each reaction temperature having about the same contact angle using the sessile drop method, condensation experiments show the lower temperature syntheses (70° C.) to be far superior at condensing and shedding droplets. The error bars represent 1 standard deviation in the measurement.

Due to many of the optimal properties for water shedding occurring at moderate synthesis temperatures of ~50° C. and low concentrations of ~10 mM, this is a low energy and chemical input with minimal reaction waste. Additionally, the surface can be tuned by simply varying the concentration and temperature to a range of pore sizes from below 50 nm to above 10 microns. FIG. 2 contains an array of highly magnified scanning electron micrographs indicating the various pore sizes and morphologies that can be grown on aluminum surfaces using this method. FIG. 3 indicates the expected contact angle achieved for the most common used reaction conditions. Despite each reaction temperature having roughly the same contact angle for a given concentration, the lower temperature samples have exhibited superior performance under condensation conditions as shown in FIG. 1.

The samples were also tested for resistance against acids, bases, hexane, acetone, ethanol, water submersion, UV exposure, high temperatures, and abrasion by superhydrophobic durability testing methods previously reported. The samples easily surpassed these standards for durability with before and after contact angle measurements being within measurement error. To further check their resistance to abrasion, the coatings were ultrasonicated in acetone and water. There was minimal degradation after 30 seconds, and superhydrophobicity was still maintained, but after 5 minutes the coating became ineffective at repelling water. This ultrasonic testing far surpasses any conditions found in real-world heat exchangers. The water jet test, which the coating passed, is a more accurate representation of the forces that will exist in an air conditioning evaporator coil.

Figure 4:
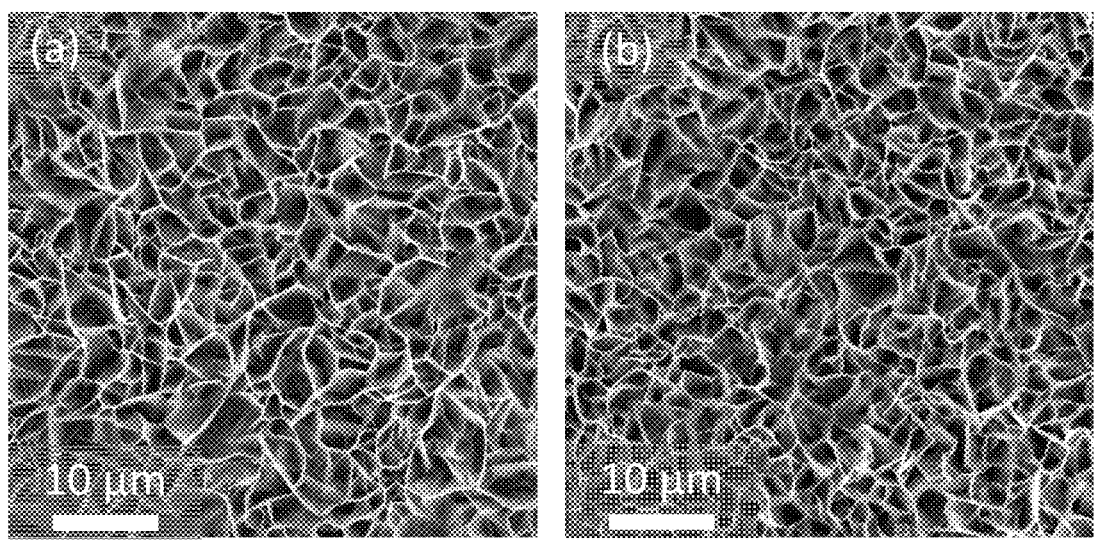
FIG. 4 shows virtually identical structures formed by reacting (a) manganese nitrate and (b) zinc nitrate with hexamine in the presence of an aluminum substrate. This resulted in the formation of porous (a) $MnO_2$ and (b) ZnO structures.

Additionally, the growth has been expanded to other material systems and is tested on other substrates. The reaction is predicted to form these porous structures under the condition that the substrate material ion has a 3+ charge and the cation of the metal nitrate salt has a 2+ charge. FIG. 4 shows the same structures grown from both manganese nitrate and zinc nitrate precursors on aluminum. This results in $MnO_2$ (a) and ZnO (b).

The above disclosure may be extended to a statistical model for the wettability of surfaces with heterogeneous pore geometries.

In the following paragraphs, it is described a new approach to modeling the wetting behavior of textured surfaces with varying degrees of geometrical heterogeneity. Surfaces are modeled as pore arrays with a Gaussian distribution of sidewall angles and a characteristic wall roughness. The model is calibrated using measured apparent contact angles between a surface and at least four probe liquids. The model is calibrated for three heterogeneous nanoporous surfaces, and compared with a regular, lithographically-produced structure. It is also demonstrated, by terminating porous zinc oxide/hydroxide with three alternative hydrophobic molecules, that a single geometrical model can capture behavior across multiple surface chemistries and liquids.

Tuning a surface's micro- and nano-structure can help to maximize the apparent contact angle of a liquid on the surface, rendering it superhydrophobic or superoleophobic. Re-entrant or under-cut surface geometries are particularly valuable because they have been shown to promote low wetting solid fractions and high contact angles even with low-surface-tension oils and fluorinated liquids that will wet almost any smooth surface.

Geometrically highly regular hydrophobic and oleophobic surfaces have been made lithographically and by other crystal etching mechanisms. Moderately regular surface structures have been made using fine woven mesh. A wide range of surfaces with much more irregular surface structures have been produced via dip-coating, spray deposition of particles and fibers, and bottom-up growth. Irregular surfaces are generally much less expensive to produce than regular, lithographically defined ones, and can be scaled more readily to larger areas, but their distributions of surface feature geometries and thus their performance are more challenging to characterize.

Figure 5:
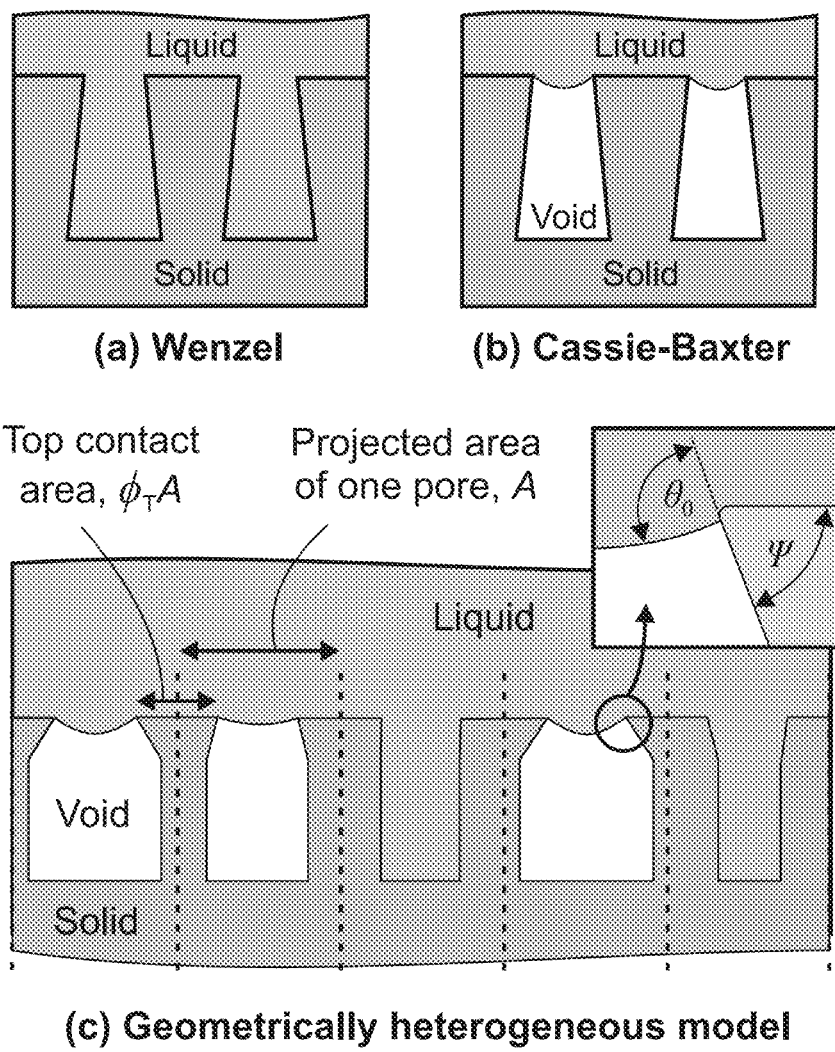
FIG. 5 shows pore geometry and the effect of its variability on a liquid's apparent contact angle. The classical (a) Wenzel and (b) Cassie-Baxter models assume completely spatially uniform surface feature geometries with a fixed re-entrant angle Ψ, resulting in complete wetting (a) where $\theta_0 < \Psi$ or complete non-wetting (b) where $\theta_0 > \Psi$. Real surfaces exhibit a range of effective Ψ, such that the fraction of pores filled will depend on $\theta_0$ (c).

The behavior of a liquid on a textured surface has conventionally been modeled either as completely wetting the surface (Wenzel mode, FIG. 5a) or as sitting entirely on top of the surface and not penetrating any pores (Cassie-Baxter mode, FIG. 5b). This binary distinction cannot, however, represent the true behavior of the many types of surfaces whose textures are spatially heterogeneous, having, for example, pores with a range of wall angles. In these situations, some pores may wet while others remain empty, depending on their local geometries.

It is herein introduced a new model to characterize geometrically heterogeneous surfaces accurately. The model takes into account the average wall angle of surface structures as well as the degree of variability of wall angle and the average roughness of the structures.

The new model's crucial contribution is the introduction of a parameter that captures the variability of pore geometry. It thus goes beyond the derivations and modifications that have previously been used to specialize the Cassie-Baxter model for particular regular geometries. It is modelled a surface as having many equal-volume pores with sidewalls whose re-entrant angles $\Psi$ near their tips approximately follow a Gaussian distribution with average reentrant angle $\Psi_0$ and standard deviation $\sigma_0$ (FIG. 5c). Let $P(\Psi)$ be the cumulative distribution function for $\Psi$.

$$P(\Psi) \approx \int_{-\infty}^{\Psi} \frac{1}{\sigma_0 \sqrt{2\pi}} e^{-\left(\frac{(\Psi' - \Psi_0)^2}{2\sigma_0^2}\right)} d\Psi'. \tag{1}$$

In the model, a pore will instantaneously and completely fill when $\theta_0$, the contact angle of the liquid on a flat surface, is less than the re-entrant angle: $\theta_0 < \Psi \theta_0 \ll \Psi$. In that situation, the surface tension of the liquid will pull the liquid down into the pore until it fills. Conversely, it is assumed that a pore remains completely empty when $\theta_0 \geq \Psi$ and the surface tension holds the liquid out of the pore. It is assumed that a liquid droplet making contact with the surface is large enough to encounter many pores. Below the droplet, the proportion of pores filled, $\phi_F$, for a given value of $\theta_0$ is:

$$\phi_F = 1 - P(\theta_0) \tag{2}$$

It is then modelled the overall apparent contact angle, $\theta^*$, of the liquid on the surface structure using a generalized Cassie-Baxter model, as follows:

$$\cos\theta = \phi_T \cos\theta_0 + (1-\phi_T)[\phi_F r \cos\theta_0 - (1-\phi_F)], \tag{3}$$

This model assumes that the projected surface area of the porous film is divided into three components (FIG. 5c). Firstly, a fraction $\phi_T$ of the area sits at the tips of the material between the pores and is always in contact with the liquid. The remaining area, the fraction $(1-\phi_T)$, is divided between a proportion $\phi_F$ of pores that are filled, and a proportion $(1-\phi_F)$ of unfilled pores in which a liquid-air interface exists. The pores are assumed to have a roughness r such that the total surface area of a pore is r times the projected area of one pore opening. This roughness plays a role only when a pore is filled with liquid. In cases where Equation 3 would imply that $\cos\theta^* > 1$, $\cos\theta^*$ is set to equal 1 and complete wetting is assumed to take place. By measuring the apparent contact angles, $\theta^*$, of four or more liquids with a range of surface tensions, one can fit estimates for $\Psi_0$, $\sigma_0$, $\phi_T$ and r, and thereby characterize a surface.

The assumption of a Gaussian distribution of the angle $\Psi$ is approximate because in engineered surfaces $\Psi$ is usually constrained to lie between $-90°$ and $180°$; $\Psi$ cannot, in reality, extend towards $\pm\infty$ as a Gaussian distribution would imply. Nevertheless, for the values of $\Psi_0 \Psi_0$, and $\sigma_0$ that we fit for actual surfaces, a negligible portion of the tails of a Gaussian distribution lie outside a realistic range of $\Psi$.

To demonstrate the model's ability to describe the behavior of real surfaces, it is fabricated and characterized three porous, liquid-repellant coatings. All materials for fabricating and characterizing the three porous coatings were obtained from Sigma-Aldrich. All of the coating methods involve inexpensive reagents and simple apparatus, and thus promise to be more affordable than precisely engineered, geometrically regular, patterned surfaces.

It is begun by considering nanoporous zinc oxide/hydroxide surfaces that were grown hydrothermally on to aluminum. The porous zinc oxide/hydroxide surfaces were synthesized by immersing an aluminum scanning electron microscopy (SEM) sample-mounting peg into a 25 mM equimolar aqueous solution of zinc nitrate and hexamine at 70° C. for one hour. The ZnO/ZnOH-coated substrates were then oxygen plasma-treated (60 W, 200 mTorr, 2 min) to clean them and impart hydroxyl surface termination. As shown in FIG. 6a, the resulting zinc oxide pore morphology is highly irregular, and pores are surrounded by thin walls of material that are aligned approximately perpendicularly to the surface of the sample but with considerable angular variation.

It is modified the zinc oxide/hydroxide surfaces in one of three ways to impart hydrophobic surface chemistry. In the first modification, the substrate was immediately placed in a vacuum desiccator with 100 μL of 1H, 1H, 2H, 2H-perfluorooctyltrichlorosilane (PFOS). The desiccator was then pumped for 20 minutes to vaporize the silane followed by letting it settle for 40 minutes before venting the chamber. Upon removal, the substrates were rinsed with deionized water to remove unreacted perfluorosilane, dried, and finally annealed at 120° C. for one hour on a hot plate. In the second modification, the substrate was dipped in a 3% perfluorooctyl polyhedral oligomeric silsesquioxane (PFO-POSS) solution in Vertrel™ XF (Dupont) for 3 minutes and then used as coated. In the third modification, the substrate was dipped in 1% (3-aminopropyl)triethoxysilane (APTES) solution in deionized water for 10 minutes, and then rinsed with deionized water and heated to 120° C. on a hot plate for one hour.

Six probe liquids were used to characterize these surfaces; these are, in descending order of surface tension, water, glycerol, thiodiglycol, polyethylene glycol diacrylate with a molar mass of 700 g, dipropylene glycol, and methanol. Values of $\theta_0$ for each liquid-solid pairing are initially determined by directly measuring the liquid's contact angle on a flat surface (in this case a silicon wafer) treated with the same surface termination as the textured surface. (Alternatively, values of $\theta_0$ are also commonly available in the literature for particular liquid-solid pairs.) An upper bound for $\phi_T$ is estimated by considering $\theta^*$ for the highest-surface-tension liquid tested in this case water and the PFO-POSS surface termination, and assuming that no pores are filled in that case. Equation 3 then reduces and rearranges to:

$$\phi_T \approx \frac{\cos\theta^* + 1}{\cos\theta_0 + 1} \quad (4)$$

This value of $\phi_T$ is an upper bound because it is possible that a few pores are in fact filled with water during the observation of $\theta^*$, so that not all the liquid-solid contact area is located within the tips of the structure. With $\theta_0$ and the upper bound on $\phi_T$ established, a least-squares error minimization routine is then used to fit $\Psi_0$, $\sigma_0$, $\phi_T$ and r. FIG. 6b shows that a single set of geometrical parameters fits the data closely for all six probe liquids and all three surface terminations. Present model finds that pores are on average moderately re-entrant, with $\Psi_0=53°$, and with a broad spread of pore geometry: $\sigma_0=23°$ (Table 1). The gradual increase of $\cos\theta^*$ with $\cos\theta_0$ indicates that a progressively larger proportion of the pores becomes filled as the contact angle of the probe liquid on a smooth surface reduces (i.e. as $\cos\theta_0$ increases).

Table 1. Summary of the model parameters fit for three heterogeneous, nanoporous surfaces and for one regular, lithographically-produced surface. The fitting parameters are: average reentrant angle ($\Psi_0$), standard deviation of the angles with respect to $\Psi_0$ (a), within-pore surface roughness factor (r), and top-of-surface solid fraction ($\phi_T$).

| Surface | $\Psi_0$ | $\sigma_0$ | r | $\phi_T$ |
|---|---|---|---|---|
| Porous ZnO | 51° | 25° | 3.5 | 0.0051 |
| PVDF microspheres | 57° | 1° | 11.2 | 0.014 |
| PTFE templated by sacrificial PS microspheres (using the method of van der Wal*) | 54° | 38° | 1.4 | 0.092 |
| Regular, re-entrant disk array# | 27° | 0° | 1.2 | 0.051 |

*Wal, P. van der; Steiner, U. Super-Hydrophobic Surfaces Made from Teflon. Soft Matter 2007, 3 (4), 426-429.
Liu, T. "Leo"; Kim, C.-J. "CJ." Turning a Surface Superrepellent Even to Completely Wetting Liquids. Science 2014, 346 (6213), 1096-1100.

As a second test-case for the model, a film composed of approximately 600 nm-diameter polyvinylidene fluoride (PVDF) spheres was synthesized by spinodal decomposition from a ternary solvent system.

Due to the precipitation kinetics, the resulting PVDF sphere size is reasonably uniform, although the spheres form clusters to create reentrant pores that are somewhat irregular in shape and many times larger than individual microspheres (FIG. 7a). This material was characterized with the same probe liquids as the zinc oxide/hydroxide, and exhibits a much sharper non-wetting-to-wetting transition (FIG. 7c) than was observed with the zinc oxide/hydroxide surface. From the contact angle measurements, an effective average sidewall angle of $\Psi_0=53°$ and a low pore sidewall angle variability of $\sigma_0=1°$ were extracted (Table 1). A high roughness of 11 is fit, and this result can be attributed both to the micro-scale roughness created by the microsphere clusters and to the nano-scale surface texture of individual microspheres that is seen in electron micrographs of the material.

As a third test-case, a porous polytetrafluoroethylene (PTFE) film was created via templating with sacrificial poly(styrene-co-divinylbenzene) (PS) microspheres, according to the procedure of van der Wal et al. (Wal, P. van der; Steiner, U. Super-Hydrophobic Surfaces Made from Teflon. Soft Matter 2007, 3 (4), 426-429). Briefly, PTFE and PS colloid suspensions in water were mixed to give a solid volume fraction of 60%, with 67% of the solid volume being the sacrificial PS. 100 μL of this suspension was blade-cast on to an aluminum SEM peg and placed on a hot plate at 120° C. for 1 hour to evaporate the water. A further hot-plate treatment at 290° C. for 30 min was used to sinter the PTFE particles together and partially decompose the sacrificial material. The PS was then removed by washing in acetone.

The resulting PTFE structure contains a broad distribution of pore sizes (FIG. 7b) by virtue of the wide distribution of sacrificial PS sphere diameters used: these diameters ranged from 1 μm to 10 μm were estimated. Using the same six probe liquids as before, surface characteristics of $\Psi_0=54°$ and $\sigma_0=38°$ were extracted, making this appear to be the most heterogeneous of the eight surfaces we have examined (FIG. 7c).

All of these trends would be impossible to capture with a simple model of completely regular, straight-side walled features; such a model can comprehend only a single, critical value of $\cos\theta_0$ below which the surface is assumed to be in Cassie-Baxter mode, and above which pore wetting is assumed to occur spontaneously and completely.

Figure 6:
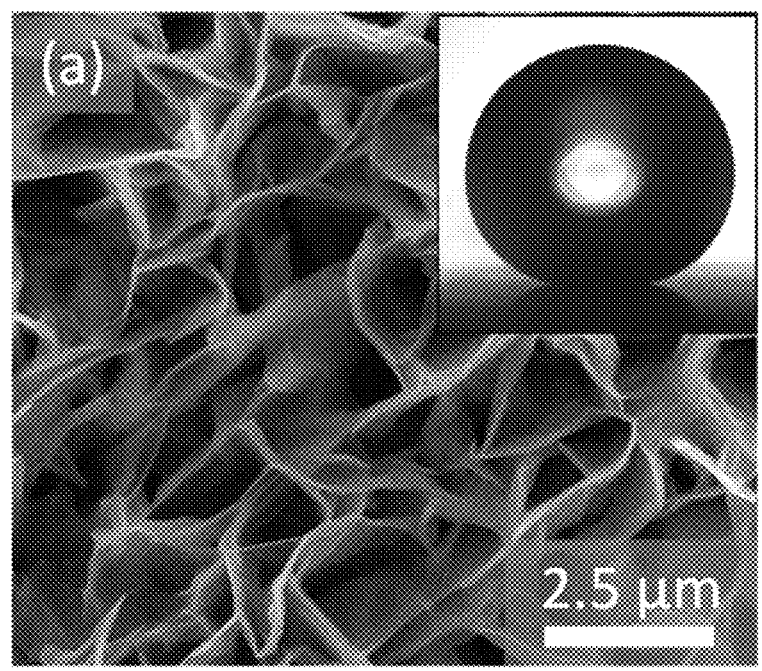
FIG. 6 shows calibration of the surface wettability model for zinc oxide/hydroxide nanoporous surfaces terminated with PFOS, PFO-POSS and APTES. The pores in the hydrothermally grown ZnO have highly heterogeneous sizes and sidewall angles, as shown in a scanning electron micrograph (a). A single set of fit parameters accurately describes the dependence of cos θ* on cos $\theta_0$ for this surface geometry with all three surface terminations (b). Error bars correspond to ±one standard error of the mean, based on five measurements.
Figure 6:
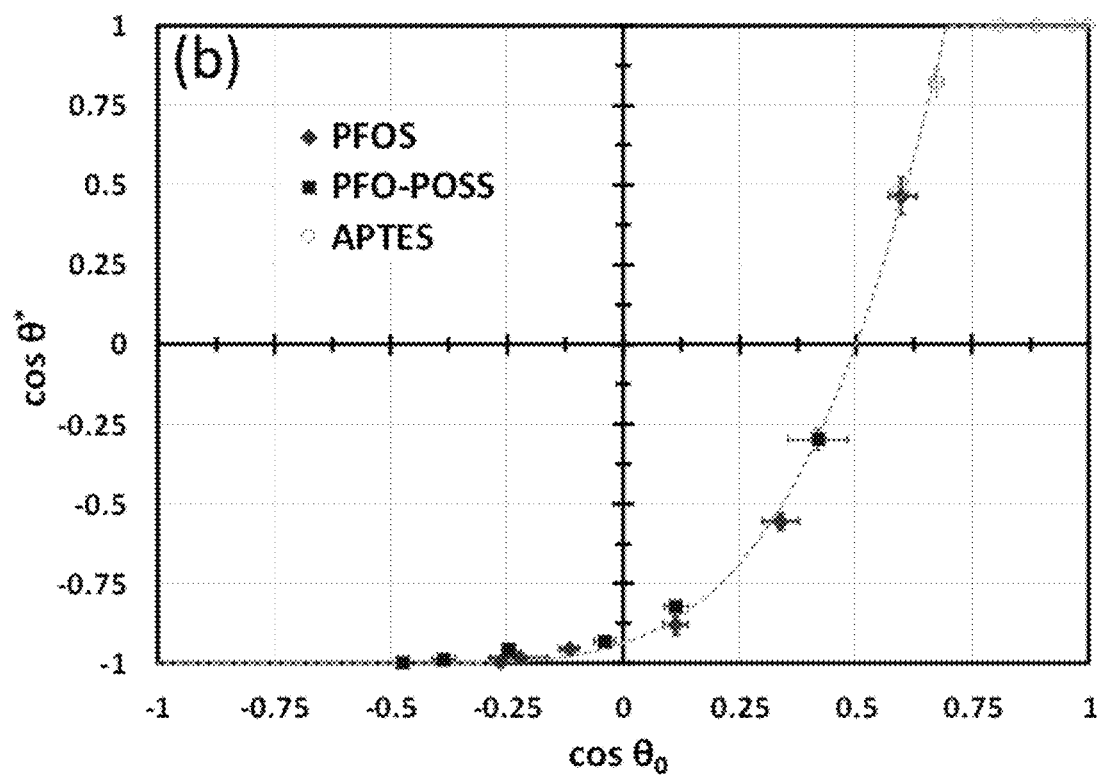
Figure 7:
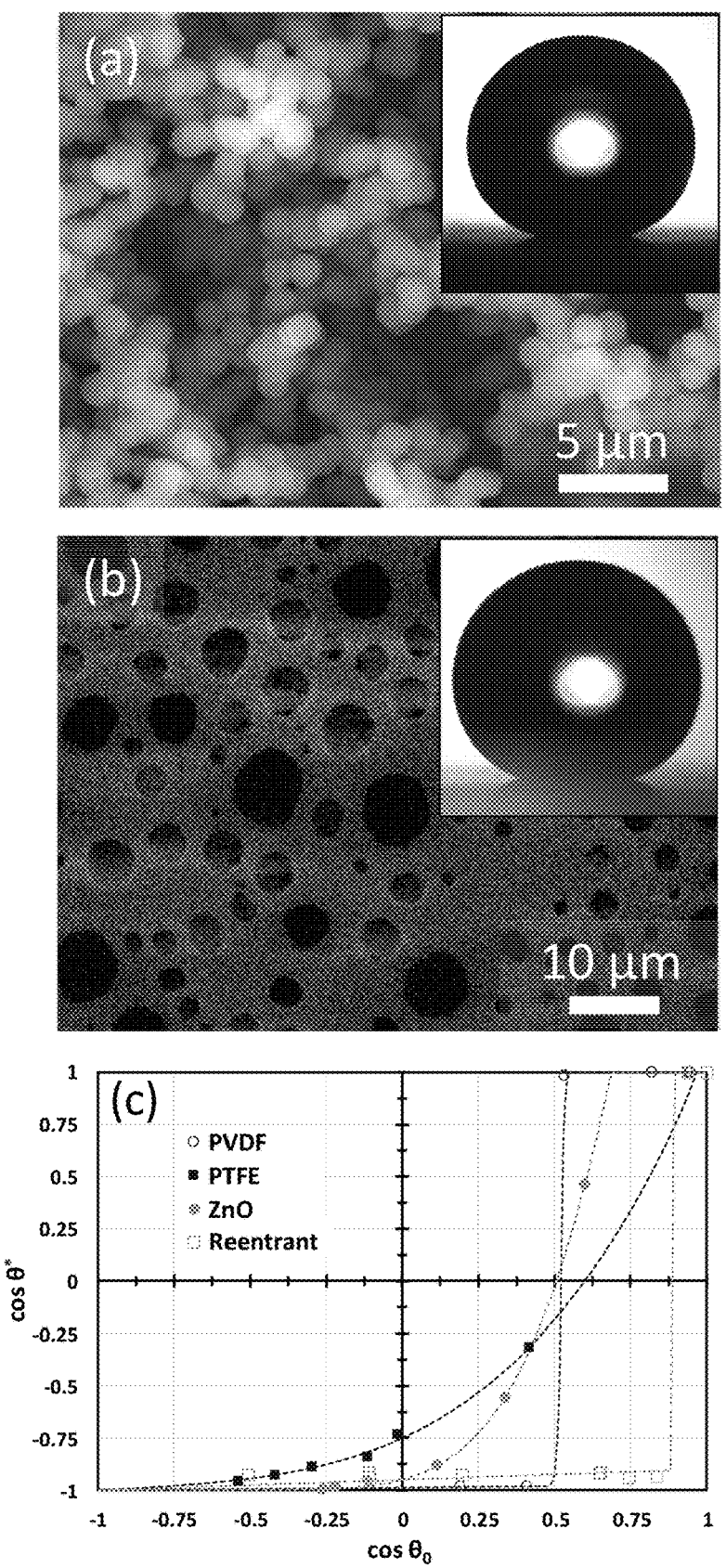
FIG. 7 shows calibration of the surface wettability model for PVDF microspheres, porous PTFE templated with sacrificial PS microspheres, hydrothermally grown nanoporous ZnO, and a regular reentrant $SiO_2$/Si microstructure. A scanning electron micrograph of the PVDF microsphere (a) shows microspheres with uniformly distributed diameters and nanoscale surface roughness. The PTFE film exhibits large variation of pore size (b). The model calibrations (c) indicate that the PTFE film shows the most gradual increase of cos θ* with cos $\theta_0$, consistent with a large spatial variation of pore geometry. Symbols for PTFE, PVDF and ZnO represent the mean of five measurements. Data for the regular reentrant structure are taken from Liu (Liu, T "Leo"; Kim, C.-J "CJ." *Turning a Surface Superrepellent Even to Completely Wetting Liquids. Science* 2014, 346 (6213), 1096-1100).

It is conceivable that the observed shapes of the cos θ* cos θ* vs. cos $\theta_0$ cos $\theta_0$ plots could be reproduced without considering pore-to-pore variability by developing instead a tailored geometrical model for sidewall profile whose angle varied with depth in such a way that every single pore would progressively fill at the same rate as cos $\theta_0$ increased. However, a very particular profile would need to be proposed for each and every material characterized, in order to capture fully the various transitions from completely non-wetting to completely wetting behavior that are shown in FIGS. 6 and 7. Present model of pore angle variability, with only four fitting parameters, is a much more realistic and versatile way to explain how irregular surfaces wet.

To contrast present randomly distributed surface geometries with a more regular geometry, the new model was used to interpret previously published data from a highly regular array of singly re-entrant surface structures that was produced lithographically by Liu and Kim (Liu, T. "Leo"; Kim, C.-J. "CJ." *Turning a Surface Superrepellent Even to Completely Wetting Liquids. Science* 2014, 346 (6213), 1096-1100). These structures consist of a square array of silicon oxide disks of diameter ~20 μm that are supported by narrower silicon pillars and coated with ~150 nm of $C_4F_8$ hydrophobic polymer. As expected, this surface exhibits a far sharper transition from non-wetting to wetting as cos $\theta_0$ increases (FIG. 7c) than do the present three more variable porous surfaces. Present least-squares fitting procedure extracts an average re-entrant angle of $\Psi_0=27°$—which is plausible if the etching of the silicon oxide disks involves some sidewall tapering together with zero angle variability $\sigma_0$, which is consistent with highly repeatable lithographic production. For this particular surface, therefore, it is reasonable to suppose that the inter-disk regions are either completely empty or completely filled according to the liquid used. Consequently, while present model-fitting procedure extracts a roughness value between the structures of r=1.2 this value has no practical relevance because as soon as any inter-structure void fills, wetting is complete and cos θ* cos θ* becomes 1.

It is thus shown that present model can be used to characterize the relationship between a liquid's contact angle on a flat surface and its apparent contact angle on a range of porous or otherwise randomly distributed material geometries. The model predicts a one-to-one relationship between the contact angle on a flat surface, $\theta_0$, and the apparent contact angle. It does not capture the possible effects of 'breakthrough', where a load such as a droplet's Laplace pressure or a randomly occurring inertial force causes the liquid surface to deform into the pore, touch its base, and wet the geometry. Rather, present model assumes that as cos $\theta_0$ increases, the sidewalls of the pores progressively guide liquid into an increasing fraction of the pores, so that the increase in cos θ*cos θ* with cos $\theta_0$ is gradual and predictable, and relies only on the action of the liquid's surface tension within the pores.

For the ZnO, PVDF and PTFE surfaces that were demonstrated here, present model is accurate because the pores are mostly sub-micrometer in size and thus highly robust against breakthrough. According to the model of, for example, Chhatre et al. (Chhatre, S. S.; Choi, W.; Tuteja, A.; Park, K.-C. (Kenneth); Mabry, J. M.; McKinley, G. H; Cohen, R. E. *Scale Dependence of Omniphobic Mesh Surfaces. Langmuir* 2010, 26 (6), 4027-4035), it is estimated the present surfaces' robustness essentially, the ratio of required breakthrough pressure to a typical droplet's Laplace pressure to be around 1000. In other words, it is very unlikely that a spontaneous Cassie-Baxter-to-Wenzel transition occurs in these structures. For materials with considerably larger pores, it may become necessary to incorporate robustness as an additional factor. Additionally, present model does not consider contact angle hysteresis or the relationship between pore geometry and pinning. Both of these considerations may be relevant in some applications.

In summary, present model is fast and simple to calibrate, requires only contact-angle measurements to be made, and provides a framework for experimentally quantifying the variability of pore geometries on surfaces. One of the method's key strengths is that once a particular surface geometry (e.g. that of porous zinc oxide/hydroxide) has been characterized, the cos $\theta_0$ vs. cos θ* relationship can be used to predict the effect of modifying the surface chemistry (e.g. PFOS or APTES) applied to that geometry, provided that the surface modification does not alter the geometry. Thus, present approach could readily be applied to the screening of multiple candidate 'omniphobic' coating processes to quantify their performance.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

REFERENCES

1. Miljkovic, N.; Enright, R.; Wang, E. N., Modeling and Optimization of Superhydrophobic Condensation. *J. Heat Transf-Trans. ASME* 2013, 135, 14.
2. Miljkovic, N.; Enright, R.; Nam, Y.; Lopez, K.; Dou, N.; Sack, J.; Wang, E. N., Jumping-Droplet-Enhanced Condensation on Scalable Superhydrophobic Nanostructured Surfaces. *Nano Lett.* 2013, 13, 179-187.
3. Sommers, A. D.; Yu, R.; Okamoto, N. C.; Upadhyayula, K., Condensate drainage performance of a plain fin-and-tube heat exchanger constructed from anisotropic microgrooved fins. *Int. J. Refrig.—Rev. Int. Froid* 2012, 35, 1766-1778.
4. Gao, L. C.; McCarthy, T. J., The "lotus effect" explained: Two reasons why two length scales of topography are important. *Langmuir* 2006, 22, 2966-2967.
5. Gao, L. C.; McCarthy, T. J., Contact angle hysteresis explained. *Langmuir* 2006, 22, 6234-6237.
6. Gao, L. C.; McCarthy, T. J., How Wenzel and Cassie were wrong. *Langmuir* 2007, 23, 3762-3765.
7. Li, W.; Amirfazli, A., A thermodynamic approach for determining the contact angle hysteresis for superhydrophobic surfaces. *J. Colloid Interface Sci.* 2005, 292, 195-201.
8. Martines, E.; Seunarine, K.; Morgan, H.; Gadegaard, N.; Wilkinson, C. D. W.; Riehle, M. O., Superhydrophobicity and superhydrophilicity of regular nanopatterns. *Nano Lett.* 2005, 5, 2097-2103.
9. Patankar, N. A., Mimicking the lotus effect: Influence of double roughness structures and slender pillars. *Langmuir* 2004, 20, 8209-8213.
10. Wier, K. A.; McCarthy, T. J., Condensation on ultrahydrophobic surfaces and its effect on droplet mobility: Ultrahydrophobic surfaces are not always water repellant. *Langmuir* 2006, 22, 2433-2436.
11. Ahuja, A.; Taylor, J. A.; Lifton, V.; Sidorenko, A. A.; Salamon, T. R.; Lobaton, E. J.; Kolodner, P.; Krupenkin, T. N., Nanonails: A simple geometrical approach to electrically tunable superlyophobic surfaces. *Langmuir* 2008, 24, 9-14.
12. Choi, C. H.; Ulmanella, U.; Kim, J.; Ho, C. M.; Kim, C. J., Effective slip and friction reduction in nanograted superhydrophobic microchannels. *Phys. Fluids* 2006, 18, 8.
13. Zhai, L.; Berg, M. C.; Cebeci, F. C.; Kim, Y.; Milwid, J. M.; Rubner, M. F.; Cohen, R. E., Patterned superhydrophobic surfaces: Toward a synthetic mimic of the Namib Desert beetle. *Nano Lett.* 2006, 6, 1213-1217.
14. Erbil, H. Y.; Demirel, A. L.; Avci, Y.; Mert, O., Transformation of a simple plastic into a superhydrophobic surface. *Science* 2003, 299, 1377-1380.
15. Feng, L.; Song, Y. L.; Zhai, J.; Liu, B. Q.; Xu, J.; Jiang, L.; Zhu, D. B., Creation of a superhydrophobic surface from an amphiphilic polymer. *Angew. Chem.—Int. Edit.* 2003, 42, 800-802.
16. Jin, M. H.; Feng, X. J.; Feng, L.; Sun, T. L.; Zhai, J.; Li, T. J.; Jiang, L., Superhydrophobic aligned polystyrene nanotube films with high adhesive force. *Adv. Mater.* 2005, 17, 1977-+.
17. Ma, M. L.; Hill, R. M.; Lowery, J. L.; Fridrikh, S. V.; Rutledge, G. C., Electrospun poly(styrene-block-dimethylsiloxane) block copolymer fibers exhibiting superhydrophobicity. *Langmuir* 2005, 21, 5549-5554.
18. Yabu, H.; Shimomura, M., Single-step fabrication of transparent superhydrophobic porous polymer films. *Chem. Mat.* 2005, 17, 5231-5234.
19. Li, X. M.; Reinhoudt, D.; Crego-Calama, M., What do we need for a superhydrophobic surface? A review on the recent progress in the preparation of superhydrophobic surfaces. *Chem. Soc. Rev.* 2007, 36, 1350-1368.
20. Miljkovic, N.; Wang, E. N., Condensation heat transfer on superhydrophobic surfaces. *MRS Bull.* 2013, 38, 397-406.
21. Rose, J. W., Dropwise condensation theory and experiment: a review. *Proc. Inst. Mech. Eng. Part A-J. Power Energy* 2002, 216, 115-128.
22. Malavasi, I.; Bernagozzi, I.; Antonini, C.; Marengo, M., Assessing durability of superhydrophobic surfaces. 2014.
23. Ma, X. H.; Wang, S. F.; Lan, Z.; Peng, B. L.; Ma, H. B.; Cheng, P., Wetting Mode Evolution of Steam Dropwise Condensation on Superhydrophobic Surface in the Presence of Noncondensable Gas. *J. Heat Transf-Trans. ASME* 2012, 134, 9.
24. Tanaka, H.; Tsuruta, T., A MICROSCOPIC STUDY OF DROPWISE CONDENSATION. *Int. J Heat Mass Transf* 1984, 27, 327-335.
25. le Fevre, E. J.; Rose, J. W., An experimental study of heat transfer by dropwise condensation. *Int. J. Heat Mass Transf* 1965, 8, 1117-1133.
26. Liu, L. P.; Jacobi, A. M.; Ashrae, The Impact of Fin Surface Wettability on the Performance of Dehumidifying Heat Exchangers. *Ashrae Transactions* 2014, Vol 120, Pt 12014, 120, 8.
27. Watanabe, K.; Yanuar; Udagawa, H., Drag reduction of Newtonian fluid in a circular pipe with a highly water-repellent wall. *J. Fluid Mech.* 1999, 381, 225-238.
28. Gratzl, G.; Paulik, C.; Lackner, M., Antimicrobial Surfaces. In *Kirk-Othmer Encyclopedia of Chemical Technology*, John Wiley & Sons, Inc. 2000.
29. Tuteja, A.; Choi, W.; Ma, M.; Mabry, J. M.; Mazzella, S. A.; Rutledge, G. C.; McKinley, G. H.; Cohen, R. E. Designing Superoleophobic Surfaces. *Science* 2007, 318 (5856), 1618-1622.
30. Tuteja, A.; Choi, W.; Mabry, J. M.; McKinley, G. H.; Cohen, R. E. Robust Omniphobic Surfaces. *Proc. Natl. Acad. Sci.* 2008, 105 (47), 18200-18205.
31. Chhatre, S. S.; Choi, W.; Tuteja, A.; Park, K.-C. (Kenneth); Mabry, J. M.; McKinley, G. H.; Cohen, R. E. Scale Dependence of Omniphobic Mesh Surfaces. *Langmuir* 2010, 26 (6), 4027-4035.
32. Liu, T. "Leo"; Kim, C.-J. "CJ." Turning a Surface Superrepellent Even to Completely Wetting Liquids. *Science* 2014, 346 (6213), 1096-1100.
33. Cao, L.; Price, T. P.; Weiss, M.; Gao, D. Super Water- and Oil-Repellent Surfaces on Intrinsically Hydrophilic and Oleophilic Porous Silicon Films. *Langmuir* 2008, 24 (5), 1640-1643.
34. Ling, X. Y.; Phang, I. Y.; Vancso, G. J.; Huskens, J.; Reinhoudt, D. N. Stable and Transparent Superhydrophobic Nanoparticle Films. *Langmuir* 2009, 25 (5), 3260-3263.
35. Cui, Z.; Yin, L.; Wang, Q.; Ding, J.; Chen, Q. A Facile Dip-Coating Process for Preparing Highly Durable Superhydrophobic Surface with Multi-Scale Structures on Paint Films. *J. Colloid Interface Sci.* 2009, 337 (2), 531-537.
36. Campos, R.; Guenthner, A. J.; Meuler, A. J.; Tuteja, A.; Cohen, R. E.; McKinley, G. H.; Haddad, T. S.; Mabry, J. M. Superoleophobic Surfaces through Control of Sprayed-on Stochastic Topography. *Langmuir* 2012, 28 (25), 9834-9841.
37. Tarwal, N. L.; Patil, P. S. Superhydrophobic and Transparent ZnO Thin Films Synthesized by Spray Pyrolysis Technique. *Appl. Surf Sci.* 2010, 256 (24), 7451-7456.

38. Zhang, Y.-L.; Wang, J.-N.; He, Y.; He, Y.; Xu, B.-B.; Wei, S.; Xiao, F.-S. Solvothermal Synthesis of Nanoporous Polymer Chalk for Painting Superhydrophobic Surfaces. *Langmuir* 2011, 27 (20), 12585-12590.
39. Hosono, E.; Fujihara, S.; Honma, I.; Zhou, H. Superhydrophobic Perpendicular Nanopin Film by the Bottom-Up Process. *J. Am. Chem. Soc.* 2005, 127 (39), 13458-13459.
40. Wenzel, R. N. Resistance of Solid Surfaces to Wetting by Water. *Ind. Eng. Chem.* 1936, 28 (8), 988-994.
41. Cassie, A. B. D.; Baxter, S. Wettability of Porous Surfaces. *Trans. Faraday Soc.* 1944, 40, 546-551.
42. Whyman, G.; Bormashenko, E.; Stein, T. The Rigorous Derivation of Young, Cassie-Baxter and Wenzel Equations and the Analysis of the Contact Angle Hysteresis Phenomenon. *Chem. Phys. Lett.* 2008, 450 (4-6), 355-359.
43. Nosonovsky, M. Multiscale Roughness and Stability of Superhydrophobic Biomimetic Interfaces. *Langmuir* 2007, 23 (6), 3157-3161.
44. McHale, G. Cassie and Wenzel: Were They Really So Wrong? *Langmuir* 2007, 23 (15), 8200-8205.
45. Marmur, A. Wetting on Hydrophobic Rough Surfaces: To Be Heterogeneous or Not To Be? *Langmuir* 2003, 19 (20), 8343-8348.
46. Erbil, H. Y.; Cansoy, C. E. Range of Applicability of the Wenzel and Cassie-Baxter Equations for Superhydrophobic Surfaces. *Langmuir* 2009, 25 (24), 14135-14145.
47. Choi, W.; Tuteja, A.; Mabry, J. M.; Cohen, R. E.; McKinley, G. H. A Modified Cassie-Baxter Relationship to Explain Contact Angle Hysteresis and Anisotropy on Non-Wetting Textured Surfaces. *J. Colloid Interface Sci.* 2009, 339 (1), 208-216.
48. Wal, P. van der; Steiner, U. Super-Hydrophobic Surfaces Made from Teflon. *Soft Matter* 2007, 3 (4), 426-429.

The invention claimed is:

1. A liquid-repellent surface comprising: a metallic substrate and a porous liquid repellent coating applied thereon; wherein the porous liquid repellent coating comprises a porous layer of a transition metal oxide, wherein the transition metal oxide comprises one or more of manganese oxide, nickel oxide, nickel hydroxide, iron oxide, or copper oxide, or copper hydroxide; and a layer of a liquid-repellent compound deposited onto the porous layer of the transition metal oxide, wherein the porous layer of the transition metal oxide comprises a plurality of surface pores of varying angles with an average angle that is reentrant, and wherein the metallic substrate contributes metal ions to form a mixed transition metal oxide with the porous layer.

2. The liquid-repellent surface of claim 1, wherein the metallic substrate is aluminium substrate.

3. The liquid-repellent surface of claim 1, wherein at least one of the plurality of surface pores has a reentrant angle of less than 90° and wherein at least one of the plurality of surface pores has an angle of more than 90°.

4. The liquid-repellent surface of claim 1, wherein the coating comprises an average within-pore surface roughness factor of about 3.5.

5. The liquid-repellent surface of claim 1, wherein the plurality of surface pores has an average diameter from about 50 nm to about 10 microns.

6. The liquid-repellent surface of claim 1, wherein the transition metal oxide comprises manganese oxide.

7. The liquid-repellent surface of claim 6, wherein the manganese oxide comprises manganese in a +2, +3, or +4 oxidation state, or a combination thereof.

* * * * *